(12) United States Patent
Rastegar et al.

(10) Patent No.: US 7,326,850 B2
(45) Date of Patent: Feb. 5, 2008

(54) METHOD AND DEVICES FOR GENERATING ENERGY FROM PHOTOVOLTAICS AND TEMPERATURE DIFFERENTIALS

(75) Inventors: Jahangir S. Rastegar, Stony Brook, NY (US); Thomas Spinelli, East Northport, NY (US)

(73) Assignee: Omnitek Partners LLC, Bayshore, NY (US)

( * ) Notice: Subject to any disclaimer, the term of this patent is extended or adjusted under 35 U.S.C. 154(b) by 868 days.

(21) Appl. No.: 10/720,507

(22) Filed: Nov. 24, 2003

(65) Prior Publication Data

US 2004/0112417 A1    Jun. 17, 2004

Related U.S. Application Data

(60) Provisional application No. 60/428,460, filed on Nov. 22, 2002.

(51) Int. Cl.
*H01L 35/00* (2006.01)

(52) U.S. Cl. .................... 136/205; 136/253

(58) Field of Classification Search ............. 136/205, 136/253
See application file for complete search history.

(56) References Cited

U.S. PATENT DOCUMENTS

| 4,500,741 | A | * | 2/1985 | Morimoto et al. | 136/206 |
| 4,714,797 | A | * | 12/1987 | Nagai | 136/206 |
| 5,518,554 | A | * | 5/1996 | Newman | 136/248 |
| 2002/0139409 | A1 | * | 10/2002 | Paramonov et al. | 136/205 |
| 2002/0148236 | A1 | * | 10/2002 | Bell | 62/3.3 |

* cited by examiner

*Primary Examiner*—Nam Nguyen
*Assistant Examiner*—Jeffrey Barton

(57) ABSTRACT

A method for generating power is provided. The method including: providing a heat source with an output of radiation in a predetermined spectrum; generating a first portion of the power from the absorption of the radiation; and generating a second portion of the power from a temperature difference between a first element heated by the heat source and a second element at least partially thermally insulated from the first element.

6 Claims, 3 Drawing Sheets

METHOD AND DEVICES FOR GENERATING ENERGY FROM PHOTOVOLTAICS AND TEMPERATURE DIFFERENTIALS

CROSS REFERENCE TO RELATED APPLICATION

This application claims the benefit of earlier filed provisional application Ser. No. 60/428,460, filed on Nov. 22, 2002, the contents of which is incorporated herein in its entirety by its reference.

BACKGROUND OF THE INVENTION

1. Field of the Invention

The present invention relates generally to power generation, and more particularly, to methods and devices for generating energy from photovoltaics and temperature differentials.

2. Prior Art

Generators are well known in the art for generating electricity, particularly those known for use in back-up situations for residential homes, commercial buildings, and hospitals. Such devices generally have two-stroke engines that operate on gasoline. The output of such engines is used to turn a generator, which produces electricity. The electricity is fed into the structure and/or supplied to an electrical grid. Such two-stroke engines (and in some applications, 4-stroke engines) are used in many other applications, such as lawn mowers and other outdoor equipment, small tractors, jet-skis and other recreational vehicles. Although, these engines have their advantages, they operate on rather expensive gasoline, significantly contribute to air pollution from their emissions, have many moving parts and are therefore complicated, and are inherently inefficient, expensive, and noisy.

Furthermore, power is often required to be transmitted across a rotating joint; such joint can rotate in one, two, or three (spherical) directions. In the prior art, slip rings are used to provide an electrical contact between the moving parts in the rotating joint. Such slip rings are expensive to manufacture and maintain and are prone to failure.

SUMMARY OF THE INVENTION

It is an object of the present invention to provide methods and devices that overcome the disadvantages of the two and four stroke engines of the prior art by providing a cleaner burning, less expensive, less complicated, more environmentally friendly, and more efficient method and device for generating power.

It is another object of the present invention to provide an improved alternative to the slip rings of the prior art that overcomes the disadvantages of the slip rings Accordingly, a method for generating power is provided. The method comprising: providing a heat source with an output of radiation in a predetermined spectrum; generating a first portion of the power from the absorption of the radiation; and generating a second portion of the power from a temperature difference between a first element heated by the heat source and a second element at least partially thermally insulated from the first element.

The method can further comprise cooling the second element. The cooling can generates a hot water byproduct.

The generating of the first portion of the power can comprise heating a secondary material to give off visible light. In which case the heating of the secondary material can be such that it glows in a spectrum that is most efficient for the generating of the first portion of the power.

Also provided is an apparatus for generating power. The apparatus comprising: a heat source with an output of radiation in a predetermined spectrum; a photovoltaic material for generating a first portion of the power from the absorption of the radiation; and thermoelectric effect means for generating a second portion of the power from a temperature difference between a first element heated by the heat source and a second element at least partially thermally insulated from the first element. The apparatus can further comprise cooling means for cooling the second element. The cooling means can comprise a water jacket disposed on the second element and a water supply for re-circulating water through the water jacket. The cooling means can also comprise a fan for forcing an airflow across the second element.

The apparatus can further comprise a secondary material disposed between the heat source and the photovoltaic material and which is heated by the heat source such that the secondary material gives off a visible light that is incident on the photovoltaic material. The secondary material can be heated such that it glows in a spectrum that is most efficient for the photovoltaic material.

Still provided is a method for generating power across a rotatable joint where the rotatable joint has first and second rotatable elements rotatably disposed relative to each other. The method comprising: providing a heat source with an output of radiation in a predetermined spectrum in the first rotatable element; generating a first portion of the power from the absorption of the radiation from the first rotatable element to the second rotatable element; and generating a second portion of the power from a temperature difference between a first element heated by the heat source and disposed on the second rotatable element and a second element disposed on the second rotatable element and at least partially thermally insulated from the first element.

The method can further comprise cooling the second element. The cooling can generate a hot air byproduct. One of the first and second elements can have an interior and the method can further comprise heating the interior at least partially with the hot air byproduct.

The generating of the first portion of the power can comprise heating a secondary material to give off visible light. In which case the method can further comprise heating the secondary material such that it glows in a spectrum that is most efficient for the generating of the first portion of the power.

Still provided is an apparatus for generating power across a rotatable joint. The apparatus comprising: first and second rotatable elements rotatably disposed relative to each other; a heat source disposed in the first rotatable element and having an output of radiation in a predetermined spectrum in the first rotatable element; a photovoltaic means in the second rotatable element for generating a first portion of the power from the absorption of the radiation from the first rotatable element; and thermoelectric effect means for generating a second portion of the power from a temperature difference between a first element heated by the heat source and disposed on the second rotatable element and a second element disposed on the second rotatable element and at least partially thermally insulated from the first element.

The apparatus can further comprise cooling means for cooling the second element. The cooling means can comprise a means for circulating air across the second element to produce a hot air byproduct. Where one of the first and second elements has an interior, the interior can be at least partially heated with the hot air byproduct.

The apparatus can further comprise a secondary material disposed between the heat source and the photovoltaic means and which is heated by the heat source such that the secondary material gives off a visible light that is incident on the photovoltaic means. The secondary material can be heated such that it glows in a spectrum that is most efficient for the photovoltaic material.

Still provided is a back-up generator comprising: a heat source with an output of radiation in a predetermined spectrum; a photovoltaic material for generating a first portion of the power from the absorption of the radiation; and thermoelectric effect means for generating a second portion of the power from a temperature difference between a first element heated by the heat source and a second element at least partially thermally insulated from the first element.

Still provided is a lawn mower comprising: a motor having a rotatable shaft; a cutting blade disposed on the shaft; a heat source with an output of radiation in a predetermined spectrum; a photovoltaic material for generating a first portion of the power from the absorption of the radiation; thermoelectric effect means for generating a second portion of the power from a temperature difference between a first element heated by the heat source and a second element at least partially thermally insulated from the first element; wherein at least a portion of the first and second portions of the power are supplied to the motor for rotation of the shaft.

Still yet provided is a tank comprising: a tank body having a first rotatable element; a turret having a second rotatable element rotatably disposed on the first rotatable element; a heat source disposed in the first rotatable element and having an output of radiation in a predetermined spectrum in the first rotatable element; a photovoltaic means in the second rotatable element for generating a first portion of the power from the absorption of the radiation from the first rotatable element; and thermoelectric effect means for generating a second portion of the power from a temperature difference between a first element heated by the heat source and disposed on the second rotatable element and a second element disposed on the second rotatable element and at least partially thermally insulated from the first element.

BRIEF DESCRIPTION OF THE DRAWINGS

These and other features, aspects, and advantages of the apparatus and methods of the present invention will become better understood with regard to the following description, appended claims, and accompanying drawings where:

DETAILED DESCRIPTION OF THE PREFERRED EMBODIMENT

Although the invention is particularly suited to the generation of relatively small amounts of power, those skilled in that art will appreciate that the devices disclosed herein may be scaled to produce larger amounts of power without any decrease in efficiency. Further, although a back-up generator, lawn mower, and spherical joint are illustrated and discussed herein, those skilled in the art will appreciate that the devices and methods of the present invention can be utilized wherever energy is required to power other elements, such as a motor, electronic components, or across any type of rotating or spherical joint.

Figure 1:
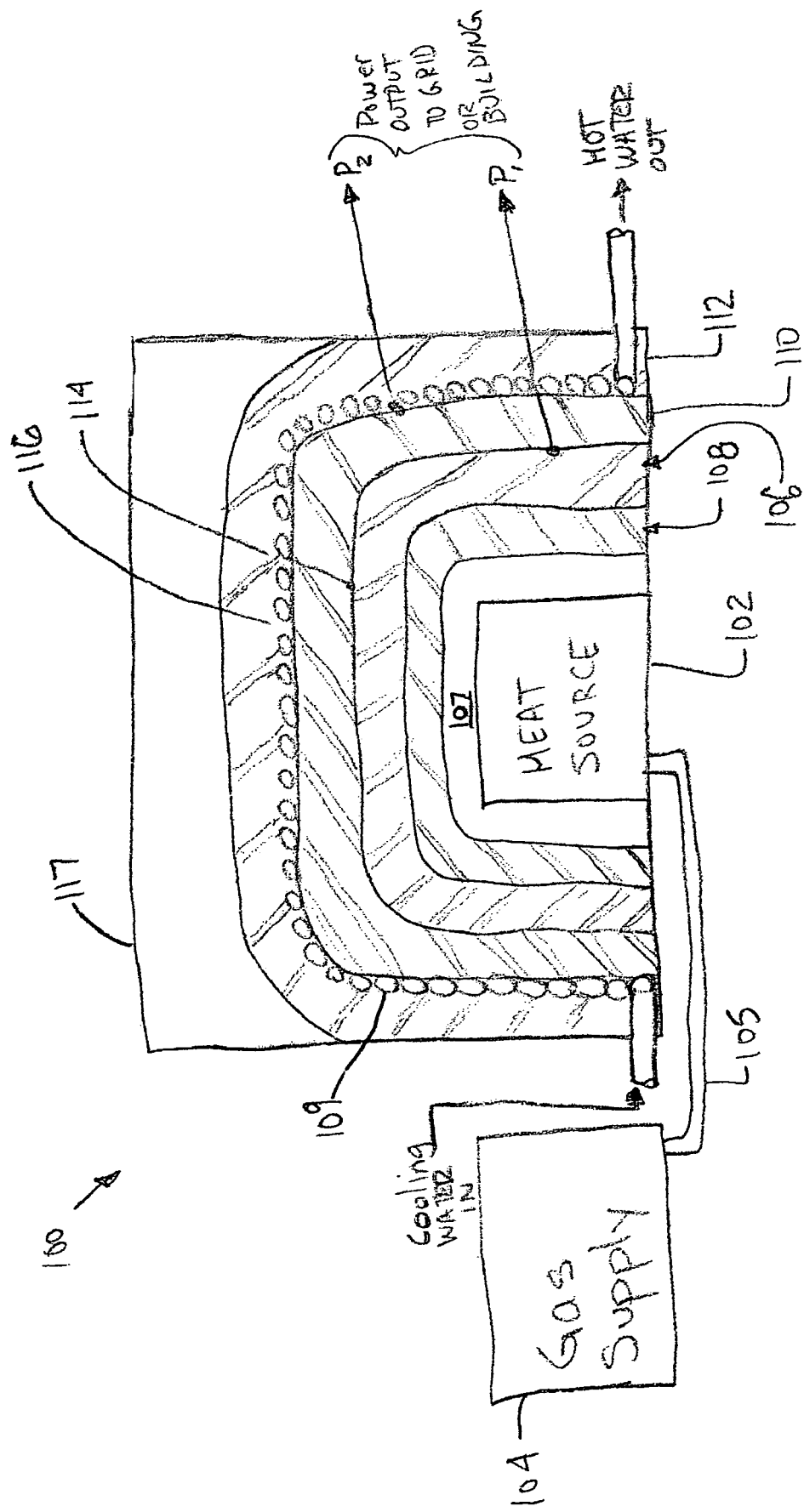
FIG. 1 illustrates a partial sectional view of a back-up generator according to a preferred implementation of the present invention.

Referring now to FIG. 1, there is shown an apparatus for producing electrical power, the apparatus being generally referred to by reference numeral 100. The apparatus has a heat source 102. The heat source can be a burner for burning a combustible gas, such as propane or natural gas from gas supply 104. A gas line 105 supplies gas to the heat source 102 from the fuel supply 104. Generally, the fuel in the fuel supply 104 is pressurized, which facilitates supplying the same to the heat source. A valve (not shown), which may be automatically controlled via a processor, can be supplied in the gas line 105 for selectively interrupting the flow of gas from the fuel supply 104 to the heat source 102. The heat source 102, such as a burner, operates in such a way that is well known in the art to produce a hot flame. It is well known to those skilled in the art how to achieve and maintain a hot flame from a gas supply, therefore such details, such as valving and ignitors are omitted herein for the sake of brevity. However, such features (e.g., ignitor, valving) may also be under the control of a processor).

The heat source 102 can also provide a source of radiation, preferably visible light, either directly or indirectly to power a photovoltaic device 106. In a direct configuration, the heat source 102 itself produces a visible light (e.g., from the flame of a burning gas), which impinges the photovoltaic device 106 to output an electrical power (P1). Photovoltaic materials and devices are well known in the art, as is their operation. In general, photovoltaic materials convert visible light to electrical power. In an indirect configuration, the heat source 102 heats a secondary material 108, such as ceramic, which is heated and glows, thus giving off visible light as a result of the heating. The secondary material 108 can be chosen such that it glows in a spectrum that is most efficient for the photovoltaic device 106. The visible light from the secondary material 108 or directly from the heat source 102 impinges the photovoltaic device 106 to output electrical power (P1). An air gap 107 can be provided between the heat source 102 and the secondary material 108 or photovoltaic device 108.

In device 100, the electrical power output from the photovoltaic device 106 is only a portion (P1) of the total electrical power output from the device 100. Preferably, electrical power (P2) is also output based on a temperature differential between hot and relatively cooler portions of the device 100. Preferably a thermoelectric cell (TEC) 110 (alternatively referred to as a thermocouple cell) is utilized to produce such power (P2). The use of TECs to produce electrical power is well known in the art. Generally, TEC's generate electrical power from a temperature differential between a hot and cold side of the device. Although a single layer or stage of TEC is shown, those skilled in the art will appreciate that multiple layers or stages can be utilized without departing from the scope of spirit of the present invention. TEC's having two or more stages are well known in the art.

One side (the hot side) 114 of the TEC 110 is disposed on a hot portion of the device, such as on the photovoltaic device 106 while the other side 116 (the cold side) is disposed on a relatively cooler portion of the device. To increase the temperature differential between the hot and cold sides 114, 116 of the TEC 110, a cooler 112 (heat transfer device) can be provided on the cold side 116 of the TEC 110. The cooler 112 can be an air-cooled device in which a fan (not shown) directs relatively cooler air across the cold side 116. Such fan can be powered by a portion of the output power (P1+P2) of the device. However, it is preferred, particularly when using the device 100 as a back-up generator, that the cooler 112 have a water jacket 109 in which case the excess heat from the device 100 is transferred to re-circulated water and utilized as a source of hot or warm water. Although shown on a surface of the cooler 112, the water jacket 109 can also be disposed on the surface of the cold side 116 of the TEC 110. The re-circulated water can be pumped through the water jacket 109 by a pump (not shown), which may also be powered by a portion of the output power (P1+P2) or by normal household or commercial water pressure. Therefore, in a power failure, the device 100 can supply both power and hot water to a building, including a residential home. Of course, the device 100 can be supplied with a covering enclosure 117 and may also have mounting means (not shown) for mounting the device to a floor, ground, or ground pad. The processor for controlling any valving, ignitor(s) and/or switches as well as any internal wiring can be provided on or in the enclosure 117.

Thus, those skilled in the art will appreciate that a total power (P1+P2) output from the device 100 (and optionally hot water) can be efficiently produced from both the visible light output and temperature output of the heat source 102. Those skilled in the art will also appreciate that the device 100 generates power with a cleaner burning fuel, in a less expensive manner, with a less complicated device having virtually no moving parts, which is more environmentally friendly (in both air and noise pollutants), and more efficiently than the two and four stroke engines of the prior art.

Figure 2:
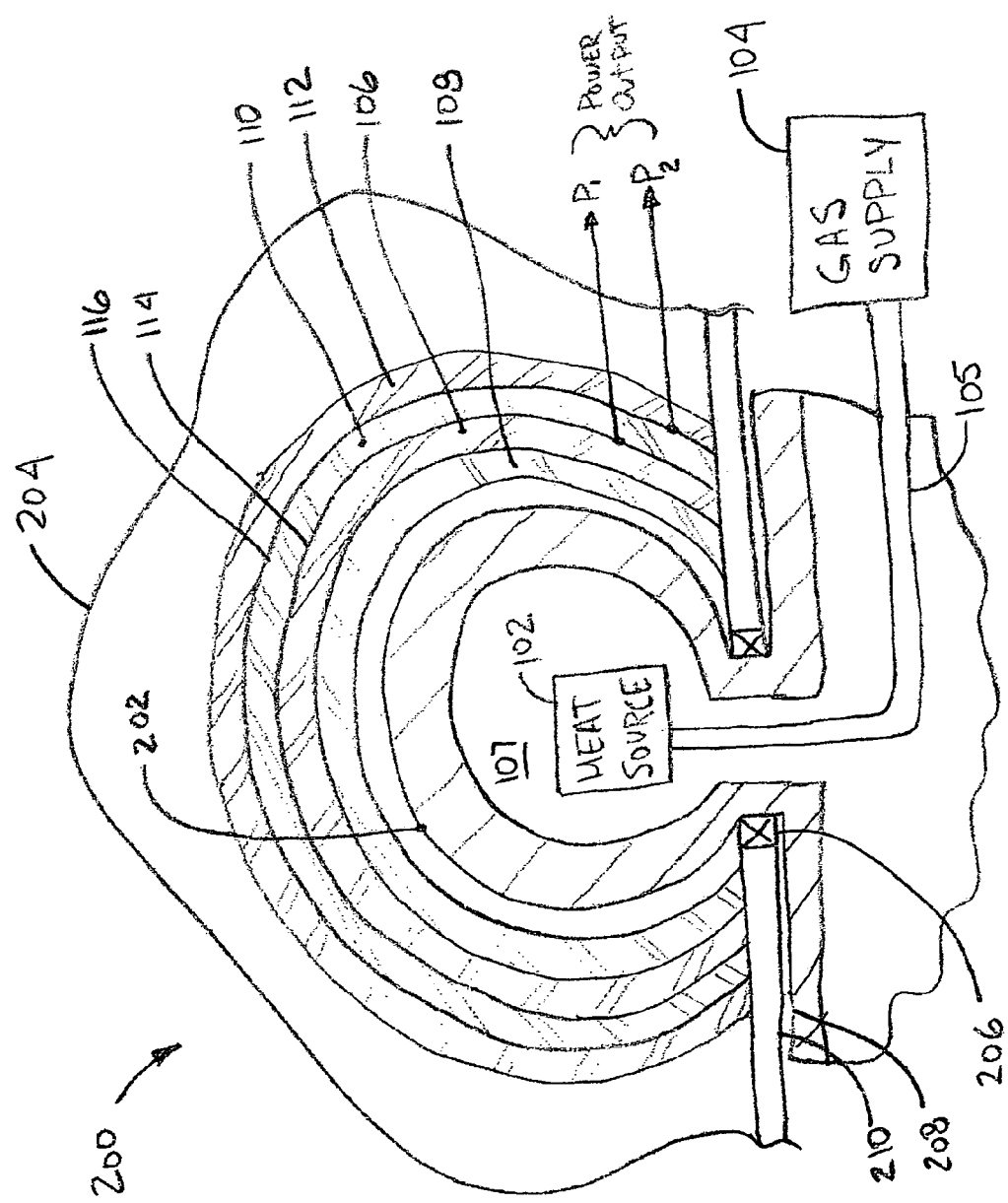
FIG. 2 illustrates a partial sectional view of a spherical joint in which power is delivered across the joint without the necessity of a slip joint according to a preferred implementation of the present invention.

Referring now to FIG. 2, in which similar numbers denote similar features to that of FIG. 1, there is shown a device for delivering power across a rotatable (in this case a spherical) joint, the device being referred to by reference numeral 200. Device 200 has first and second members 202, 204 that have surfaces that move relative to each other. Although the device 200 has particular utility where the first and second members 202, 204 rotate relative to each, the invention is not restricted to such movement, for instance, the first and second members 202, 204 can also translate relative to each other. A simple bearing 206 is shown as a schematic illustration only, and not to limit the rotation to a single direction, those skilled in the art will appreciate that the first and second members 202, 204 can rotate in two or three directions, such as in a spherical joint without limiting the scope or spirit of the present invention. The bearing 206 may also be disposed between surfaces 208 and 210.

In device 200, the heat source 102, preferably from burning of a combustible gas from gas supply 104 is provided in a chamber 107 in the first member 202. As a result of the visible light generated either directly or indirectly from the heat source 102, a total power is output at the second member 204 across the moving (e.g., rotatable) joint. As discussed above, a first portion (P1) of the power is generated as a result of the visible-light impinging the photovoltaic device 106 and the second portion (P2) is generated due to the TEC 110, which utilizes the temperature differential between a hot side and cold side thereof. In non-generator backup applications it is preferred that the cold side of the TEC 110 be air cooled with a fan (not shown) which supplies cooling air across the TEC 110.

Those skilled in the art, will appreciate that the device 200 of the present invention generates and delivers power across a moving joint with little expense, complexity, and likelihood for failure as compared to the slip rings of the prior art. The relative movement between the components of the joint can be any type known in the art, such as rotatable, spherical or linear. Although, the device 200 has utility in many applications, it has particular utility for a rotating turret in a tank, where the first member 202 is carried on the body of the tank and the second member 204 is the movable turret. In such a configuration, the fuel supply 104 can be separate from or the same as the fuel supply for the tank. Furthermore, any heat resulting from cooling of the cold side 116 of the TEC 110 can be used to heat the interior of the tank.

Figure 3:
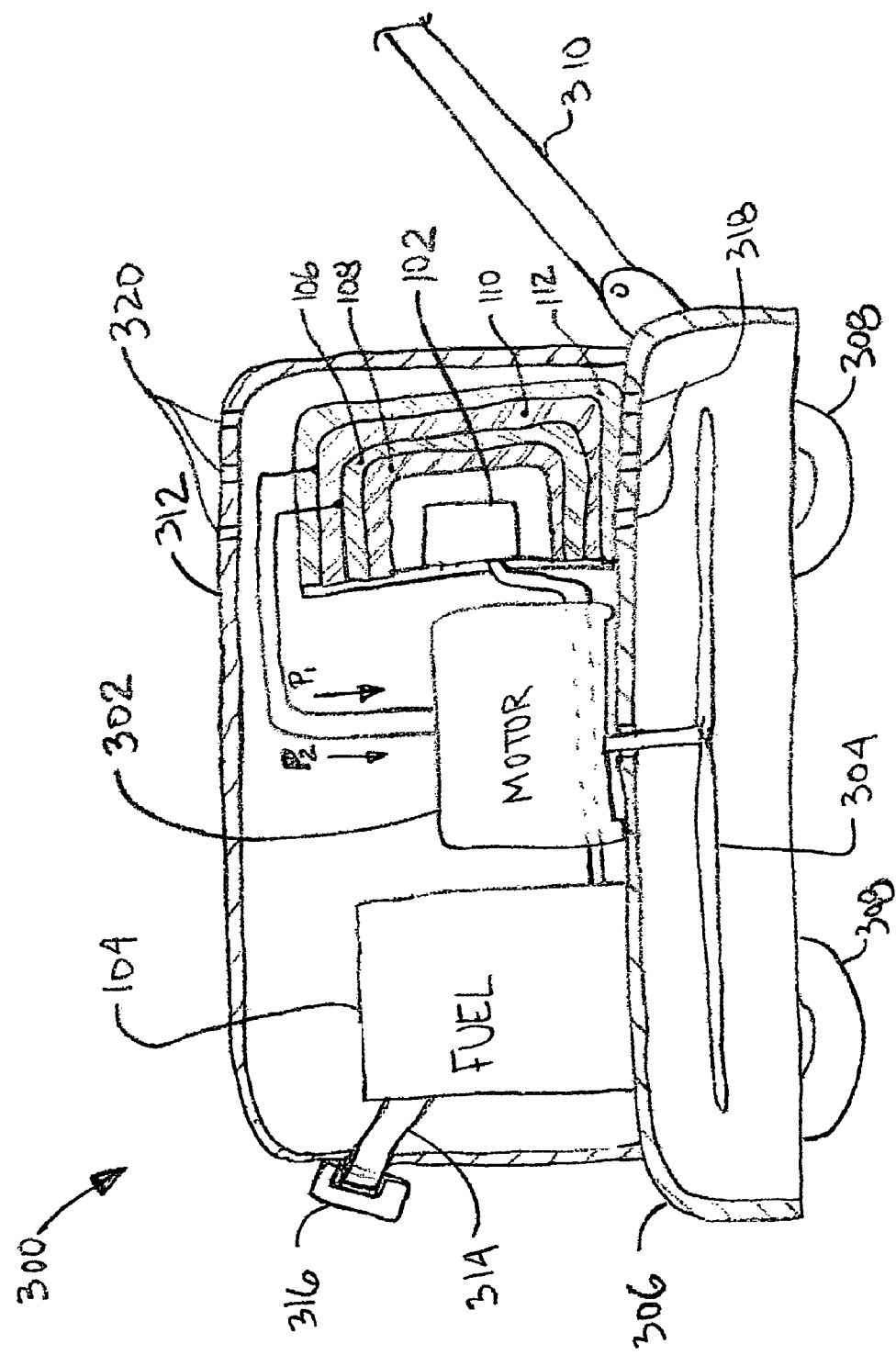
FIG. 3 illustrates a sectional view of a lawn mower according to a preferred implementation of the present invention.

Referring now to FIG. 3, there is shown a device 300, which normally would require a two or four stroke engine, having a power generation device of the present invention. Such a device 300 is illustrated, as a lawn mower, however, those skilled in the art will appreciate that numerous portable devices would benefit from such power generation scheme. In the device 300., the power (P1 and P2) is provided to a motor 302, which powers a blade 304 for cutting grass. In device 300, the blade 304 is housed in a housing 306 which rotatably supports wheels 308 and a handle 310. The fuel supply 104, motor 102 and heat source 102 can be housed in an enclosure 312. A fuel inlet 314 can be provided with a cap 316 to refill the fuel supply 104 with fuel. Alternatively, the entire fuel supply 104 may be changed, such as a propane tank. In portable devices, hot water is not usually necessary, therefore the cold side 116 of the TEC can be air-cooled. Air-cooling of the cold side 116 of the TEC 110 can at least partly be provided by the blade 304 through openings 318 in the housing 306. Further openings 320 can be provided in the enclosure to provide a cross-flow of air across the cold side 116 of the TEC 110.

The power generation schemes of the present invention can also be scaled down to power small electronic devices. These small electronic devices can include, but are not limited to handheld devices, such as cellular phones, laptop computers, and personal digital assistants (PDAs).

Although the apparatus of the present invention are shown with a single stage of thermophotovoltaic units, those skilled in the art will appreciate that more than one such stage can be utilized. For example, a first stage thermophotovoltaic unit can be disposed near the heat source and "tuned" to a first temperature. For purposes of this disclosure, "tuned," means a temperature or temperature range at which the thermophotovoltaic unit, i.e., both the emitter and the photovoltaic cells, are most efficient. Since the amount of heat energy available to the first thermophotovoltaic unit for conversion to electrical energy, i.e., the heat given off by the heat source, is much greater than the amount of heat that is actually converted to the electrical energy by the first thermophotovoltaic unit since such units currently have efficiencies of the order of 10-20%, the remaining heat (a difference between the heat of the heat source and the heat converted to electrical energy in the first thermophotovoltaic unit) is dissipated through convection, conduction, radiation or otherwise. The remaining heat is then used in connection with a second stage thermophotovoltaic unit that is "tuned" to the second stage temperatures and the remaining heat if additional stages are to be employed. The stages can continue as long as the temperatures are high enough for efficient power generation by thermophotovoltaic cells. Preferably, the heat from a stage is dissipated to a subsequent stage with forced convection of air or other appropriate gaseous and/or fluid flow that can be generated by a fan or a pump and/or by conduction. The heat removed at one stage of the thermophotovoltaic cells is then used to heat the emitters of the following thermophotovoltaic cells. The photovoltaic cells are also preferably insulated by relatively transparent materials that would efficiently transmit the radiated range of spectrum generated by the emitters in order to reduce the need for excessive cooling. Cooling of the photovoltaic cells is generally required since they operate efficiently at temperatures that are much below the temperatures that the emitter has to be heated to efficiently emit light within the desired range of spectrum. In an embodiment of the present invention, one or more layers of thermoelectric cells are positioned behind the photovoltaic cell elements to provide part or all the necessary cooling. The staging of the thermophotovoltaic materials units can continue until there is no useful temperature gradient and heat remaining, or preferably, the thermophotovoltaic stages are used in combination with thermoelectric cells. In such a configuration, one or more thermoelectric cells are used as a last stage when the temperature and the amount of heat remaining becomes low and within the operating range for the thermoelectric cells.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A method for generating power across a rotatable joint, the rotatable joint having first and second rotatable elements rotatably disposed relative to each other, the method comprising:
    providing a heat source with an output of radiation in a predetermined spectrum in the first rotatable element;
    generating a first portion of the power from the absorption of the radiation from the first rotatable element to the second rotatable element; and
    generating a second portion of the power from a temperature difference between a first element heated by the heat source and disposed on the second rotatable element and a second element disposed on the second rotatable element and at least partially thermally insulated from the first element.

2. The method of claim 1, further comprising cooling the second element.

3. The method of claim 2, wherein the cooling generates a hot air byproduct.

4. The method of claim 3, wherein, one of the first and second elements has an interior, the method further comprising heating the interior at least partially with the hot air byproduct.

5. The method of claim 1, the generating of the first portion of the power comprises heating a secondary material to give off visible light.

6. The method of claim 5, further comprising heating the secondary material such that it glows in a spectrum that is most efficient for the generating of the first portion of the power.

* * * * *